(12) United States Patent
Park

(10) Patent No.: US 6,528,216 B2
(45) Date of Patent: Mar. 4, 2003

(54) PHASE SHIFT MASK AND FABRICATION METHOD THEREOF

(75) Inventor: Jeong-Kweon Park, Cheongju (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 118 days.

(21) Appl. No.: 09/749,574

(22) Filed: Dec. 28, 2000

(65) Prior Publication Data

US 2001/0009281 A1 Jul. 26, 2001

(30) Foreign Application Priority Data

Jan. 25, 2000 (KR) .......................................... 2000-3419

(51) Int. Cl.[7] ............................................... G03F 9/00
(52) U.S. Cl. ......................................................... 430/5
(58) Field of Search ..................... 430/5, 322, 324, 430/394, 296, 311, 313

(56) References Cited

U.S. PATENT DOCUMENTS

| | | | | |
|---|---|---|---|---|
| 5,637,424 A | * | 6/1997 | Haruki et al. ................... | 430/5 |
| 5,989,756 A | * | 11/1999 | Nakae ............................ | 430/5 |
| 6,280,888 B1 | * | 8/2001 | Nakabayashi et al. ......... | 430/5 |

* cited by examiner

Primary Examiner—S. Rosasco
(74) Attorney, Agent, or Firm—Birch, Stewart, Kolasch & Birch, LLP

(57) ABSTRACT

A phase shift mask and a fabrication method thereof are used in a semiconductor light exposing process, where a CD (Critical Dimension) formed on a wafer is the same in all directions, even when a pattern is arranged on the mask at an anisotropic pitch. The phase shift mask includes a number of light transmitting regions and first and second phase shift regions arranged among the light transmitting regions. The first and second phase shift regions have a refractive index different from that of the light transmitting region. The first and second phase shift regions also have a transmittance different from each other.

21 Claims, 3 Drawing Sheets

FIG. 1
BACKGROUND ART
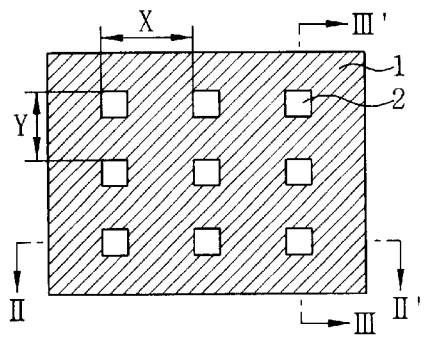
FIG. 2A
BACKGROUND ART
FIG. 2B
BACKGROUND ART
FIG. 2C
BACKGROUND ART
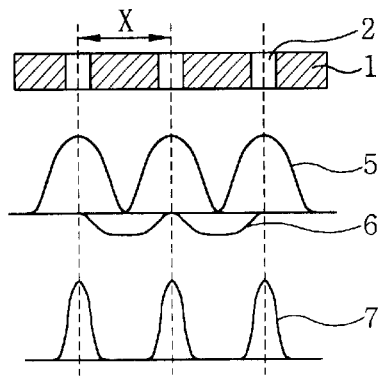
FIG. 3A
BACKGROUND ART
FIG. 3B
BACKGROUND ART
FIG. 3C
BACKGROUND ART
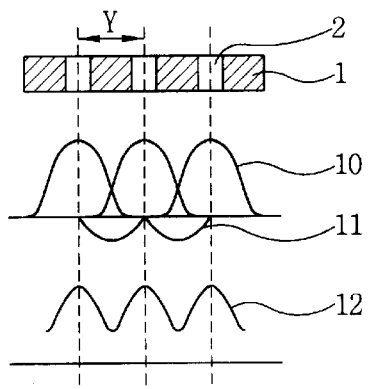
FIG. 4
BACKGROUND ART
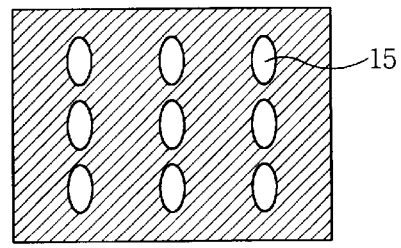

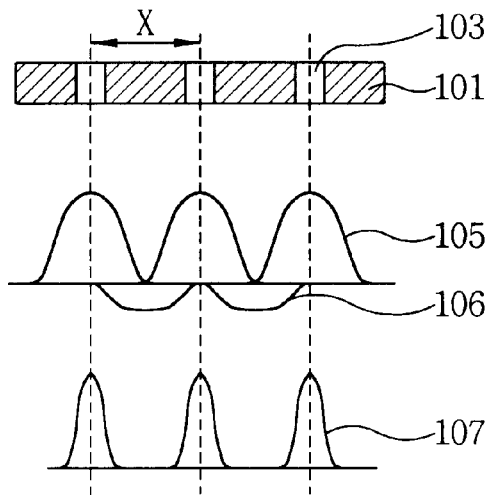
FIG. 6A
FIG. 6B
FIG. 6C
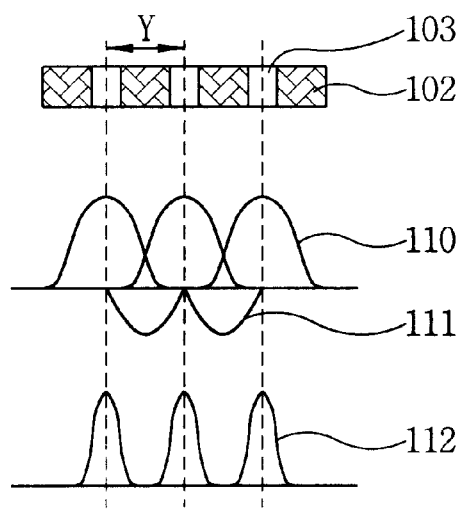
FIG. 7A
FIG. 7B
FIG. 7C
FIG. 8
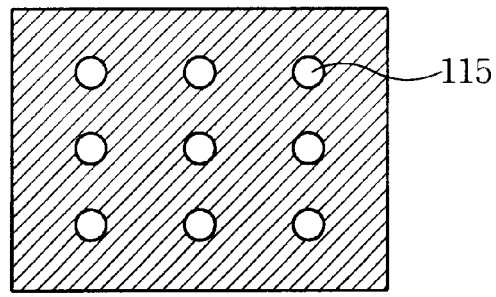

PHASE SHIFT MASK AND FABRICATION METHOD THEREOF

BACKGROUND OF THE INVENTION

1. Field of the Invention

The present invention relates to a phase shift mask and a fabrication method thereof which are used in a semiconductor light exposing process.

2. Description of the Background Art

As the integration density of semiconductor devices has increased, a distance between elements of a transistor in devices, (e.g., a capacitor, a wire, etc.) has decreased. Therefore, a technique is required for forming a fine pattern needed for semiconductor device fabrication.

Generally, a light exposing mask used for a light exposure process for forming a photoresist film pattern is formed by coating a light shield film such as a chromium film, an aluminum film, etc. on an upper surface of a quartz substrate. A part of the light shield film is then etched using an ion beam etching method, etc. to form a light exposure pattern. However, when a light exposure mask which uses the above-described light shield pattern is used, it is impossible to form a fine pattern having a visibility limit which is slightly lower than that of a stepper light source.

Recently, phase shift masks have been studied and used for forming fine patterns. Phase shift masks are formed with a semi-transparent phase shift region and a transparent light transmitting region. The light transmitting region and phase shift region have different refractive indexes and transmittance with respect to an incident wave. When the light wave which is transmitted by the phase shift region reaches the wafer, the wave has a phase difference. Therefore, the phase shift mask has information concerning a light intensity and information concerning the phase, where the light exposure mask which uses the conventional light exposure film pattern only has information concerning the light intensity.

The wave which is transmitted by the phase shift region and the wave which is transmitted by the light transmitting region interfere due to their phase difference. As a result, the photoresist film pattern formed using the phase shift mask has visibility superior to the photoresist film pattern formed based on the light exposure mask, so that it facilitates forming a fine pattern.

When the pattern formed on the mask is arranged based on an anisotropic pitch, (i.e., when the size of each light transmitting region formed on the mask is significantly larger than the wavelength of the exposing light) a phase having a shape similar to the shape of the light transmitting region pattern is formed on an upper surface of the wafer. When the size of the light transmitting region pattern has feature size similar to the wavelength of the exposing light, a circular-shaped phase is formed irrespective of the shape of the light transmitting region pattern.

FIG. 1 illustrates a conventional phase shift mask. The phase shift mask includes a phase shift region 1 and a light transmitting region 2. As shown therein, a square-shaped light transmitting region 1 is arranged with an "X" pitch in a first direction and is arranged at a "Y" pitch in a second direction. The phase shift region 1 is positioned among the thusly arranged light transmitting regions 2. The phase shift region 1 is formed of the same material over its entire area and has the same thickness, thereby obtaining the same transmittance.

FIG. 2A is a cross-sectional view taken along line II–II' of the phase shift mask in FIG. 1. FIG. 2B illustrates an amplitude and phase which are obtained when the wave 5, which is transmitted by each light transmitting region 2 of the phase shift mask of FIG. 2A, and the wave 6, which is transmitted by each phase shift region 1, reach the wafer. As shown therein, the wave 5 does not overlap itself and has a 180° phase difference with respect to the wave 6. In addition, the amplitude of the wave 5 is larger than the amplitude of the wave 6.

Since the wave 5, which is transmitted by the light transmitting region 2 of FIG. 2A, and the wave 6, which is transmitted by the phase shift region 1, have a 180° phase difference, the waves symmetrically interfere. As a result, as shown in FIG. 2C, a wave 7 is formed. The wave 7 forms an image having a large visibility on an upper surface of the wafer.

FIG. 3A is a cross-sectional view taken along line III–III' of the phase shift mask in FIG. 1. As shown therein, the light transmitting region 2 is formed at a "Y" pitch, and the value of "Y" is smaller than the value of "X".

FIG. 3B illustrates an amplitude and phase which are obtained when the wave 10, transmitted by each light transmitting region 2 of the phase shift mask of FIG. 3A, and the wave 11, transmitted each phase shift region 1, reach the wafer. As shown therein, the waves 10 overlap and have a 180° phase difference with respect to the waves 11. The overlapping of the waves 10 increases as the value of "Y" of the arrangement pitch of the light transmitting region 2 decreases. The amplitude of the wave 10 is larger than the amplitude of the wave 11.

Since the phase shift regions of the conventional phase shift mask all have the same transmittance, the amplitude of the wave 11 is the same as the amplitude of the wave 6, both of which are transmitted by the phase shift region 1.

Since the wave 10 and the wave 11 of FIG. 3B have a phase difference of 180°, the waves symmetrically interfere. The overlapping waves 10 and the waves 11 combine to form a wave 12 having a phase and amplitude as shown in FIG. 3C. The wave 12 formed by the above-described interference and overlapping phenomena forms a certain image on the wafer which has a decreased visibility. As the arrangement pitch "Y" of the light transmitting region 2 is decreased, the size of the overlap which is formed by the waves 10 increases, and the visibility of the image formed on the wafer decreases.

FIG. 4 illustrates an image formed on the wafer during a light exposing process using the phase shift mask as shown in FIG. 1. As shown in FIG. 1, the phase shift mask includes a square light transmitting region 2 having a pitch of "X" in a first direction and a pitch of "Y" in a second direction. As shown in FIG. 4, an elliptical image 15 is formed by such a mask on the upper surface of the wafer.

When the size of each light transmitting region has a value similar to that of the exposing light's wavelength, a circular image is not formed. Rather, an elliptical shape image 15 is formed, because when the pitches "X" and "Y" are different, the visibility of the image formed on the wafer is different in each direction. Therefore, the shape of the image formed on the wafer is expanded in the direction that the arrangement pitch between the light transmitting regions is narrow and overlap of transmitted waves occurs.

Therefore, as the arrangement pitch of the light transmitting region 2 is decreased, the shape of the image formed on the wafer changes. As the integration of the semiconductor device is increased, such distorting effect is increased.

In particular, the above-described shape variation is increased when the arrangement pitch between the light transmitting region patterns is below two times of the exposing light's wavelength. When the wavelength of a light source is smaller than that of the arrangement pitch between the light transmitting region patterns, it is possible to overcome the above-described problems. However, using such a light source creates problems.

When the image formed on the wafer is varied, errors in the fabrication process increase, thereby decreasing the yield, and the reliability of the semiconductor device is decreased.

SUMMARY OF THE INVENTION

Accordingly, the present invention is directed to a phase shift mask and a fabrication method thereof that substantially obviates one or more of the problems due to limitations and disadvantages of the related art.

In accordance with the purpose of the invention, as embodied and broadly described, in one aspect the invention includes a phase shift mask, including: a plurality of light transmitting regions arranged at different pitches; and a plurality of phase shift regions having a plurality of different transmissivities and formed among the light transmitting regions.

In another aspect, the invention includes a phase shift mask, including: a plurality of light transmitting regions; and a plurality of phase shift regions formed near the light transmitting regions, each phase shift region having a refractive index different from a refractive index of the light transmitting regions and having a transmittance different from at least one other phase shift region.

In still another aspect, the invention includes a phase shift mask, including: a plurality of light transmitting regions arranged at different pitches in a plurality of directions; a plurality of first phase shift regions formed adjacent to the light transmitting regions in one direction among the directions, the first phase shift regions having a refractive index different from a refractive index of the light transmitting regions and having a first transmittance; and a plurality of second phase shift regions formed adjacent to the light transmitting regions in another direction among the directions, the second phase shift regions having a refractive index different from a refractive index of the light transmitting regions and having a second transmittance different from the first transmittance.

In yet another aspect, the invention includes a phase shift mask fabrication method, including: forming a film by coating a material having a different refractive index and transmittance from a substrate on an upper surface of the substrate; selectively varying a thickness of the film; and patterning the film.

Accordingly, the present invention advantageously provides a phase shift mask and a fabrication method thereof which are capable of increasing the yield of a semiconductor device fabrication and significantly enhancing the reliability of a semiconductor device by providing the same critical dimension of images formed on a wafer when a pattern is formed on a mask based on an anisotropic pitch arrangement.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate one embodiment of the invention and together with the description serve to explain the principles of the invention.

BRIEF DESCRIPTION OF THE DRAWINGS

The present invention will become better understood with reference to the accompanying drawings which are given only by way of illustration and thus are not limitative of the present invention, wherein:

FIG. 1 is a plan view illustrating a conventional phase shift mask;

FIG. 2A is a horizontal cross-sectional view taken along line II–II' of a phase shift mask of FIG. 1;

FIG. 2B is a graph of a phase and an amplitude of a wave which is transmitted by a light transmitting region of the phase shift mask in FIG. 2A, and of a wave which is transmitted by the phase shift region;

FIG. 2C is a graph of a phase and an amplitude of a wave formed after the waves in FIG. 2B have interfered;

FIG. 3A is a horizontal cross-sectional view taken along line III–III' of a phase shift mask of FIG. 1;

FIG. 3B is a graph of a phase and an amplitude of a wave which is transmitted by a light transmitting region of the phase shift mask in FIG. 3A, and of a wave which is transmitted by the phase shift region;

FIG. 3C is a graph of a phase and an amplitude of a wave formed after the waves in FIG. 3B have interfered;

FIG. 4 is a plan view illustrating an image formed on an upper surface of a wafer using the conventional phase shift mask of FIG. 1;

FIG. 6A is a horizontal cross-sectional view taken along line VI–VI' of a phase shift mask of FIG. 5A;

FIG. 6B is a graph of a phase and an amplitude of a wave which is transmitted by a light transmitting region of the phase shift mask in FIG. 6A, and of a wave which is transmitted by a first phase shift region;

FIG. 6C is a graph of a phase and an amplitude of a wave after the waves in FIG. 6B have interfered;

FIG. 7A is a horizontal cross-sectional view taken along line VII–VII' of the phase shift mask in FIG. 5A;

FIG. 7B is a graph of a phase and an amplitude of a wave which is transmitted by a light transmitting region of the phase shift mask in FIG. 7A, and of a wave which is transmitted by a first phase shift region;

FIG. 7C is a graph of a phase and an amplitude of a wave after the waves of FIG. 7B have interfered; and FIG. 8 is a plan view illustrating an image formed on an upper surface of a wafer using a phase shift mask of FIG. 5A.

DETAILED DESCRIPTION OF THE PREFERRED EMBODIMENTS

The phase shift mask and a fabrication method thereof according to the present invention will be explained with reference to the accompanying drawings.

Figure 5A:
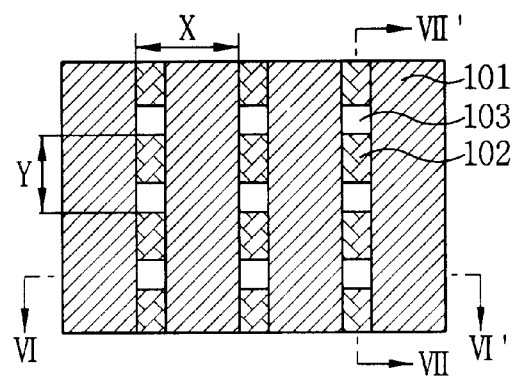
FIG. 5A is a plan view illustrating a phase shift mask according to an embodiment of the present invention.

FIG. 5A illustrates a phase shift mask according to the present invention. As shown therein, the phase shift mask includes a first phase shift region 101, a second phase shift region 102, and a light transmitting region 103. The light transmitting region 103 is formed based on a X-pitch in a first direction and a Y-pitch in a second direction. The first phase shift region 101 is formed between the light transmitting regions 103 in the first direction, and the second phase shift region 102 is formed in the second direction.

The light transmitting region 103 has a light transmittance higher than that of the first phase shift region 101 and the second phase shift region 102. The first phase shift region 101 and the second phase shift region 102 have different transmittances. The first phase shift region 101 and the second phase shift region 102 are formed of different materials and/or have different thickness so that the first phase shift region 101 and the second phase shift region 102 have different transmittances.

The light transmitting region 103 is formed of a transparent material such as a glass or quartz. The first phase shift region 101 and the second phase shift region 102 are formed of a material such as MoSiO, MoSiON, etc. having a refractive index different from the material of the light transmitting region. The first phase shift region 101 and the second phase shift region 102 have the same refractive index.

Figure 5B:
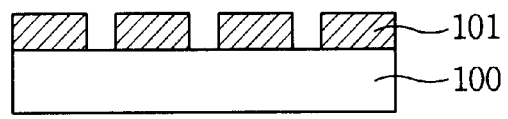
FIG. 5B is a cross-sectional view showing the step for forming a first film.
Figure 5C:
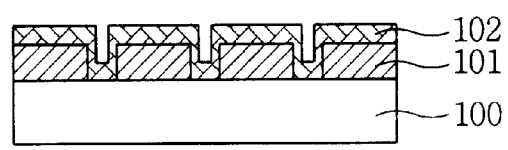
FIG. 5C is a cross-sectional view showing the step for forming a second film.
Figure 5D:
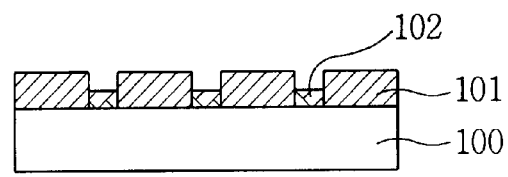
FIG. 5D is a cross-sectional view showing the step for patterning the second film.

FIGS. 5B to 5D illustrate the method for fabricating a phase shift mask of the present invention. As shown in FIG. 5B, a material 101 (e.g., MoSiO, MoSiON) having a different refractive index and transmittance from that of a transparent substrate is deposited to form as a first phase shift region on an upper surface of the substrate 100. Next, a film 102 for forming a second phase shift region is deposited on the first phase shift region 101 and the substrate 100 as shown in FIG. 5C. At this time, the regions for forming the first phase shift region 101 and the second phase shift region 102 are separated. The thickness of the first phase shift region 101 and the second phase shift region 102 are formed differently, or the materials used to form the first phase shift region 101 and the second phase shift region 102 are different. If the regions 101 and 102 are formed of different materials, such materials may be separately deposited onto the first and second regions via known photolithographic techniques. Alternatively, if the regions 101 and 102 are to have different thicknesses, a single layer of material may be deposited on a substrate and then etched to different thicknesses. The regions 103 in FIG. 5A may be formed before or after the regions 101 and 102. In one embodiment, the regions 103 are defined by etching away a portion of the transparent substrate. Finally, the thusly coated film 102 are patterned by, for example, an ion beam etching method to fabricate a phase shift mask according to the present invention as shown in FIG. 5D. Various techniques will be appreciated by those skilled in the semiconductor fabrication art to produce, for example, the co-planar structures shown in FIGS. 6A and 7A.

FIGS. 6B and 6C and FIGS. 7B and 7C illustrate the amplitudes and phases of a wave which is transmitted by the phase shift mask when the arrangement pitch "X" of the light transmitting region in the first direction has a larger value than the arrangement pitch "Y" of the light transmitting region in the second direction in the phase shift mask of FIG. 5A. When the wave of the light transmitted by the second phase shift region 102 and the wave of the light transmitted by the light transmitting region 103 reach the wafer, a phase difference of 180° occurs.

FIG. 6A is a cross-sectional view taken along line VI–VI' of the phase shift mask of FIG. 5A. As shown therein, the light transmitting region 103 has a "X" pitch arrangement, and the first phase shift region 101 is formed between the light transmitting regions 103.

FIG. 6B is a view illustrating an amplitude and phase which are formed when a wave 105, which is transmitted by each light transmitting region 103 of the phase shift mask of FIG. 6A, and a wave 106, which is transmitted by the first phase shift region 101, reach the wafer. As shown therein, the waves 105 do not overlap each other and have a phase difference of 180° with respect to the wave 106. In addition, the amplitude of the wave 105 has a larger amplitude than the amplitude of the wave 106.

Because the wave 105 and the wave 106 have a phase difference of 180°, the waves 105 and 106 interfere, so that a wave 107 having the amplitude and phase as shown in FIG. 6C is formed. The wave 107 forms an image having good visibility on the upper surface of the wafer.

FIG. 7A is a cross-sectional view taken along line VII–VII' of the phase shift mask of FIG. 5A. As shown therein, the light transmitting region 103 is arranged to have the pitch of "Y". The value of "Y" is smaller than the pitch value of "X". The second phase shift region 102 is formed between the light transmitting regions 103.

FIG. 7B illustrates an amplitude and phase when the wave 110, which is transmitted by the light transmitting region 103 of the phase shift mask of FIG. 7A, and the wave 111, which is transmitted by the second phase shift region 102, reach the wafer. As shown therein, the wave 110 overlaps itself and has a phase difference of 180° with respect to the wave 110. As the pitch value of "Y" between the light transmitting regions 103 is decreased, the overlap of the wave 110 increases. The amplitude of the wave 110 is larger than the amplitude of the wave 111. In addition, since the second phase shift region 102 has a transmittance larger than that of the first phase shift region 101, the amplitude of the wave 111 is larger than the amplitude of the wave 106, which is transmitted by the first phase shift region 101.

Because the wave 110 and the wave 111 have a phase difference of 180°, the waves 110 and 111 symmetrically interfere.

In a preferred embodiment of the present invention, the amplitude of the wave 111 is controlled by properly controlling the transmittance of the second phase shift region 102. As a result, an effect of the overlapping waves 110 is offset, thereby forming a wave 112 having a waveform shown in FIG. 7C. The wave 112 of FIG. 7C and the wave 107 of FIG. 6C have the same amplitude and phase. Therefore, the image formed on the upper surface of the wafer by the wave 112 of FIG. 7C and the image formed on the upper surface of the wafer by the wave 107 of FIG. 6C have the same visibility.

FIG. 8 illustrates an image formed on the wafer during the light exposing process using the phase shift mask of FIG. 5A. When the phase shift mask according to the present invention is used, even when the light transmitting region 103 is arranged to have different pitches in the first and second directions, the same-sized CDs (Critical Dimensions) are obtained in all directions.

As described above, in the phase shift mask according to the present invention, it is possible to obtain the same CD in all directions, even when the patterns formed on the phase shift mask have different pitches, by properly varying the transmittance of a plurality of phase shift regions formed on the phase shift mask. As a result, the fabrication yield of the semiconductor products is increased, and the reliability of the semiconductor device is enhanced.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds, are therefore intended to be embraced by the appended claims.

What is claimed is:

1. A phase shift mask, comprising:
a plurality of light transmitting regions arranged at a first pitch in a first direction and a second pitch in a second direction, the second direction being perpendicular to the first direction;
a plurality of first phase shift regions formed adjacent each of the light transmitting regions in the first direction; and
a plurality of second phase shift regions formed adjacent each of the light transmitting regions in the second direction.

2. A phase shift mask, comprising:
a plurality of light transmitting regions; and
a plurality of phase shift regions formed adjacent the light transmitting regions, each phase shift region having a refractive index different from a refractive index of the light transmitting regions, the plurality of phase shift regions having a first phase shift region and a second phase shift region having a different transmittance than the first phase shift region, and the first phase shift region being adjacent a light transmitting region of the plurality of light transmitting regions in a first direction, and the second phase shift region being adjacent the light transmitting region of the plurality of light transmitting regions in a second direction,
wherein the first direction is perpendicular to the second direction.

3. A phase shift mask, comprising:
a plurality of light transmitting regions arranged at different pitches in a plurality of directions;
a plurality of first phase shift regions formed adjacent to the light transmitting regions in a first direction of the plurality of directions, the first phase shift regions having a refractive index different from a refractive index of the light transmitting regions and having a first transmittance; and
a plurality of second phase shift regions formed adjacent to the light transmitting regions in a second direction of the plurality of directions, the second phase shift regions having a refractive index different from a refractive index of the light transmitting regions and having a second transmittance different from the first transmittance,
wherein the first direction and second direction are perpendicular.

4. The mask of claim 3, wherein said first transmittance and said second transmittance are such that a light wave transmitted along the one direction and another light wave transmitted along the another direction have the same wave form.

5. A phase shift mask, comprising:
a plurality of light transmitting regions arranged with a first spacing in a first direction and arranged with a second spacing which is larger than the first spacing in a second direction, the second direction being perpendicular to the first direction;
a plurality of first phase shift regions formed adjacent the light transmitting regions in the first direction, the first phase shift regions having a refractive index different from a refractive index of the light transmitting regions and having a first transmittance; and
a plurality of second phase shift regions formed adjacent the light transmitting regions in the second direction, the second phase shift regions having a refractive index different from the refractive index of the light transmitting regions and having a second transmittance different from the first transmittance.

6. The mask of claim 5, wherein said light transmitting regions are formed of a transparent material.

7. The mask of claim 6, wherein said transparent material is a quartz or a glass.

8. The mask of claim 5, wherein said first phase shift region and said second phase shift region have different thicknesses.

9. The mask of claim 5, wherein said first phase shift region is formed of MoSiO or MoSiON.

10. The mask of claim 5, wherein said first phase shift and said second phase shift region are formed of different materials.

11. The mask of claim 5, wherein said first transmittance is greater than the second transmittance.

12. A phase shift mask fabrication method, comprising:
forming a first film by coating a first material having a refractive index, different from that of a substrate, and a first transmittance on a first region of an upper surface of the substrate;
forming a second film by coating a second material having a refractive index, different from that of the substrate, and a second transmittance different from the first transmittance; and
patterning the first and second films to expose areas of the substrate, such that the first film is adjacent the exposed area of the substrate in a first direction and the second film is adjacent the exposed area of the substrate in a second direction, the second direction being perpendicular to the first direction.

13. A phase shift mask fabrication method, comprising:
forming a film by coating a material having a different refractive index and transmittance from a substrate on an upper surface of the substrate;
selectively varying a thickness of the film to form first and second phase shift regions, each having a different transmittance; and
patterning the film to form a plurality of light transmitting regions among the first and second phase shift regions by exposing the substrate, such that a first phase shift region is adjacent the exposed substrate in a first direction, and a second phase shift region is adjacent the exposed substrate in a second direction, and the second direction is perpendicular to the first direction.

14. The method of claim 13, wherein said substrate is formed of a quartz or glass.

15. The method of claim 13, wherein a material coated on the upper surface of the substrate is MoSiO or MoSiON.

16. A phase shift mask, comprising:
a plurality of light transmitting regions having a first pitch in a first direction and having a second pitch, which is larger than the first pitch, in a second direction;
a plurality of first phase shift regions formed adjacent the light transmitting regions along the first direction and having a first transmittance; and a plurality of second phase shift regions formed adjacent the light transmitting regions and having a second transmittance which is smaller than the first transmittance, wherein the first direction is perpendicular to the second direction.

17. The mask of claim 16, wherein said light transmitting regions are formed of a transparent material.

18. The mask of claim 16, wherein said second phase shift regions are thicker than said first phase shift regions.

19. The mask of claim 16, wherein said first phase shift regions and said second phase shift regions are formed of different materials.

20. The mask of claim 16, wherein each of said first phase shift regions is bordered by two light transmitting regions along the first direction and is bordered by two second phase shift regions along the second direction.

21. The mask of claim 16, wherein when the light transmitting regions have equal dimensions in the first and second directions, light transmitted through the mask to a wafer has equal dimensions in the first and second directions.

* * * * *